United States Patent [19]

Anvari

[11] Patent Number: 5,610,554
[45] Date of Patent: Mar. 11, 1997

[54] CANCELLATION LOOP, FOR A FEED-FORWARD AMPLIFIER, EMPLOYING AN ADAPTIVE CONTROLLER

[75] Inventor: Kiomars Anvari, Walnut Creek, Calif.

[73] Assignee: Aval Communications Inc., Walnut Creek, Calif.

[21] Appl. No.: 489,539

[22] Filed: Jul. 14, 1995

Related U.S. Application Data

[63] Continuation-in-part of Ser. No. 422,596, Apr. 14, 1995, and a continuation-in-part of Ser. No. 282,132, Jul. 28, 1994, Pat. No. 5,485,120.

[51] Int. Cl.$^6$ .................................. H03F 3/66; H03F 1/26
[52] U.S. Cl. ............................................. 330/52; 330/151
[58] Field of Search .............................. 330/52, 107, 129, 330/136, 149, 151

[56] References Cited

U.S. PATENT DOCUMENTS 5,119,040  6/1992  Long et al. ........................ 330/149
5,166,634  11/1992  Narahashi et al. ................ 330/52
5,386,198  1/1995  Ripstrand et al. ................ 330/52

*Primary Examiner*—Steven Mottola
*Attorney, Agent, or Firm*—Townsend and Townsend and Crew LLP; Kenneth R. Allen

[57] ABSTRACT

An adaptive control system and method is provided in a feed-forward linear amplifier, and in particular a multi-channel linear amplifier, wherein analyzed distortion or error detection of nonlinear distortion components of the output signal of a main amplifier element is used to correct distortion in amplification of an information signal using a two-stage distortion correction circuit. Analysis of the distortion is based on a sweep of the entire operating frequency band from which the distortion components are extracted. I.F. sampling (sub-harmonic sampling) may be used in analog-to-digital conversion of an I.F. signal to detect the distortion within a pass-band.

24 Claims, 5 Drawing Sheets

CANCELLATION LOOP, FOR A FEED-FORWARD AMPLIFIER, EMPLOYING AN ADAPTIVE CONTROLLER

CROSS-REFERENCE TO RELATED APPLICATIONS

This invention is a continuation-in-part of copending U.S. patent application Ser. No. 08/422,596 filed Apr. 14, 1995, pending which is a continuation-in-part of co-pending U.S. patent application Ser. No. 08/282,132 filed Jul. 28, 1994, both incorporated herein by reference.

BACKGROUND OF THE INVENTION

The present invention relates to radio frequency (RF) power amplifiers and methods for minimizing distortion by employing adaptive control circuitry, particularly in feed-forward power amplifiers, and the application of such control circuitry in wireless telecommunication systems, especially multi-carrier amplifiers.

Amplifiers are used to amplify an electrical signal in voltage, current or power. Amplifying devices are typically not perfectly linear over the whole of their operating ranges, and the nonlinearities in their transfer characteristics introduce distortion at the output of the amplifier.

Class "A" and "AB" amplifiers at best produce −30 to −35 dBc third-order intermodulation (IM3) distortion unless they are operated significantly below maximum power. To operate well below maximum power while achieving a desired power level requires a very high power amplifier, which is not always a viable solution.

A well-known and established linearization technique is the use of feed-forward circuitry with the amplifier. The potential problem, however, with standard feed-forward circuits is in the design of the distortion (error) amplifier and the fact that for a class-A or class-AB main amplifier, at least 35 to 40 dB of further cancellation is required to achieve −70 dBc IM3. The implication is that an amplitude error of less than 0.2 dB and a phase error of less than 0.5 degrees must be achieved for proper operation of the system. Although the amplifier system can initially be set to meet these performance specifications, it is widely believed, as a result of component aging, environmental conditions, and other factors which introduce drift, such systems are dynamic and will inevitably fail to sustain required performance levels.

One potential solution is to create a feedback loop based on a dynamic vector modulator which can be added to the amplifier assembly with a feed-forward linearizer. The dynamic vector modulator might be controlled through a microprocessor or DSP-based controller. A high level block diagram of such a feed-forward amplifier 375 including an adaptive controller 382 is shown in FIG. 2. The present invention is of this class.

U.S. Pat. No. 3,922,617, issued Nov. 25, 1975 to Denniston, discloses a feed-forward amplifier system as shown in FIG. 3. In this system, a sample of the input signal is subtractively combined with a sample of the output signal to produce a sample of the distortion products. The distortion sample is adjusted in phase and amplitude and subtractively combined with the device output signal to produce a distortion-reduced system output. First and second pilot signals, applied to the input of the feed-forward amplifier and the output of the main amplifier respectively, are detected in the sample of distortion product and the system output in order to produce control signals which adjust the phase and amplitude of the input signal and the distortion signal to provide a system which automatically compensates for uncontrolled variations caused by system components and operating environment.

The Denniston system requires a coherent detection network for the injected pilot signals to provide the correct control signal for phase and amplitude adjustment. Coherent detection adds inherent complexity to the system and makes implementation significantly difficult, especially for multi-carrier systems.

U.S. Pat. No. 4,412,185, issued Oct. 25, 1983 to Gerard, describes another feed-forward amplifier system, as shown in FIG. 4 herein. Referring to the numbered regions of the figure, the signals from elements 8 and 5 are subtracted at element 7 to provide a distortion signal amplified and inverted at element 10 which is combined at element 11 with amplified signal 26. A reference signal from frequency generator 13 is injected at main amplifier 2 into the in-band frequency, such that it appears at the output terminal as if an amplification-induced distortion. Monitor circuit 14 monitors the reference signal from frequency generator 13, present at output terminal 3, and modifies the characteristics of phase and amplitude equalizer 15 so as to remove injected reference signal 13 from the amplified output signal at output terminal 3.

As with the Denniston system, the reference (pilot) signal used may be either a single tone, which is adjusted successively to a desired reference frequency, or employs a comb of frequencies like those typically generated by a comb generator. Where a single reference signal is employed, it must be monitored and employed to repeatedly adjust the appropriate frequency band of the equalizer for each successive reference frequency in order to perform a cancellation. Where a comb of frequencies is used, monitoring must be frequency selective, and therefore it must adjust and respond to each particular comb frequency while the appropriate band of the equalizer is adjusted.

While this prior art patent teaches a system that attempts to achieve intermodulation product cancellation over a wide range of frequency bands, it nonetheless suffers from the shortcoming that several equalizer band adjustments must be performed before a desired degree of distortion cancellation is achieved. The time required to perform these successive corrections adversely impacts system distortion cancellation and performance.

The prior art teaches the down-conversion of RF signals to DC, prior to sampling and digital processing, thus resulting in the introduction of spurious noise and so-called "DC offset." These imperfections, though not problematic for many applications, can seriously degrade system performance when introduced into the digital domain, especially in cases where the control of system components is sensitive to minor changes in sampled and processed RF signals.

What is needed is a distortion minimization system for feed-forward amplifiers, including multi-carrier feed-forward amplifiers, which, rapidly and with precision, maintains a close dynamic balance between delay and amplification branches of both main and distortion (error) amplifier loops, thus maximizing distortion cancellation in a multitude of conditions. Furthermore, such systems must be easy to implement, be economical, and must not introduce undue complexity.

SUMMARY OF THE INVENTION

According to the invention, an adaptive control system and method is provided in a feed-forward linear amplifier, and in particular a multi-channel linear amplifier system, wherein a spread spectrum pilot component is introduced into the signal path prior to amplification by a main amplifier element and wherein first, second and third digitally-controlled analog feed-forward loops are employed along the signal path to correct distortion in amplification of an information signal. In the first loop the input signal is compared over the entire operating frequency bandwidth with an amplified representation of the input signal to determine a difference or error signal. The error signal is used in feedback control of gain and phase in the amplified signal path. Control for the second loop and the third loop is based on analysis of the spread spectrum pilot component at the output of the amplifier system. Intermediate frequency (I.F.) sampling (sub-harmonic sampling) may be used in analog-to-digital conversion of an I.F. signal to detect the distortion within a pass-band.

In a particular embodiment, an amplifier circuit receives an input signal having at least one carrier therein in a specified frequency band, and includes a feed-forward circuit with a distortion (error) detection circuit for detecting a nonlinear distortion component of a main amplifier output and a distortion (error) rejection circuit for amplifying a detected distortion signal by a distortion (error) amplifier, which detected distortion signal is injected into the output of the main amplifier to cancel and thus eliminate the distortion components.

In a specific embodiment each of the three distortion equalizers comprise, for example, a phase equalizer and variable gain equalizer. One equalizer is operationally positioned at the input of the main amplifier. A second equalizer is positioned to equalize the difference between the main amplifier output and the delayed input signal wherein the amplified output is injected into the signal path after an appropriate second delay in the main signal path. Control is based on monitoring of the pilot signal at the system output. The third equalizer is positioned to further minimize the residual distortion in the amplified output of the second equalizer loop based also on monitoring of the pilot signal at the system output. The third equalizer output is injected into the signal path after an appropriate third delay in the main signal path. The control signals for the equalizers are provided by a digital analysis and control system.

The control signals for the equalizers can be provided by the following:

a- Using a fast frequency synthesizer to scan the in-band and out-of-band frequencies in ΔF steps, differentiating the distortion (error) products from the desired modulated carriers, measuring the amplitude of the distortion (error) products at the output of the feed-forward amplifier, and producing the control signals to minimize the distortion (error) products.

b- Scanning the ΔF bands which contain a pilot signal (provided that a pilot is used), extracting the pilot, measuring its power, and producing the control signal to minimize it.

Samples from main amplifier input and output and distortion (error) amplifier inputs are first processed in a receiver which converts the RF signals to filtered intermediate frequency (I.F.) signals. These I.F. signals are then converted directly to the digital domain, without conversion to DC. Digital signal processing yields the equalizer control signals.

The present invention also provides a means for automatically calibrating amplifier systems at the time of manufacture and/or periodically thereafter, in order that the systems compensate for changes in overall operating tolerances and characteristics.

The present invention also includes means for generating an alarm signal which shuts down the amplifier system in the event of a significant system control imbalance.

The invention also provides means for remotely monitoring the output spectrum of the feed-forward amplifier using an RS232 interface of a micro-processor which communicates with the digital signal processing section.

The invention also provides means for monitoring the number of input carriers and dynamically adjusting the feed-forward amplifier operation bias to improve the overall power efficiency.

The speed and accuracy with which the present invention can maintain feed-forward amplifier systems in balance and thus virtually distortion-free make it particularly well-suited for implementation with multi-carrier systems. The invention provides an opportunity for significantly down-sizing and consolidating amplification equipment commonly used in mobile cellular, micro-cellular, personal communication systems and networks (PCS and PCN), fixed wireless, and special mobile radio (SMR) systems. The invention can also be employed for linear amplification in satellite, microwave, and cable transmission systems.

The invention will be better understood upon reference to the following detailed description in connection with the following drawings.

DESCRIPTION OF SPECIFIC EMBODIMENTS

In a specific embodiment of the invention, a feed-forward amplifier system using the signal samples from the three monitoring points is coupled with an adaptive control system. The signal samples from the main amplifier output are used by the adaptive controller to calculate the control signals for the equalizers in the distortion (error) amplifier path. The signal samples from error amplifier inputs are used by the adaptive controller to calculate the control signal for the equalizer in the main amplifier path.

A. Feed-forward Amplifier.

Figure 1:
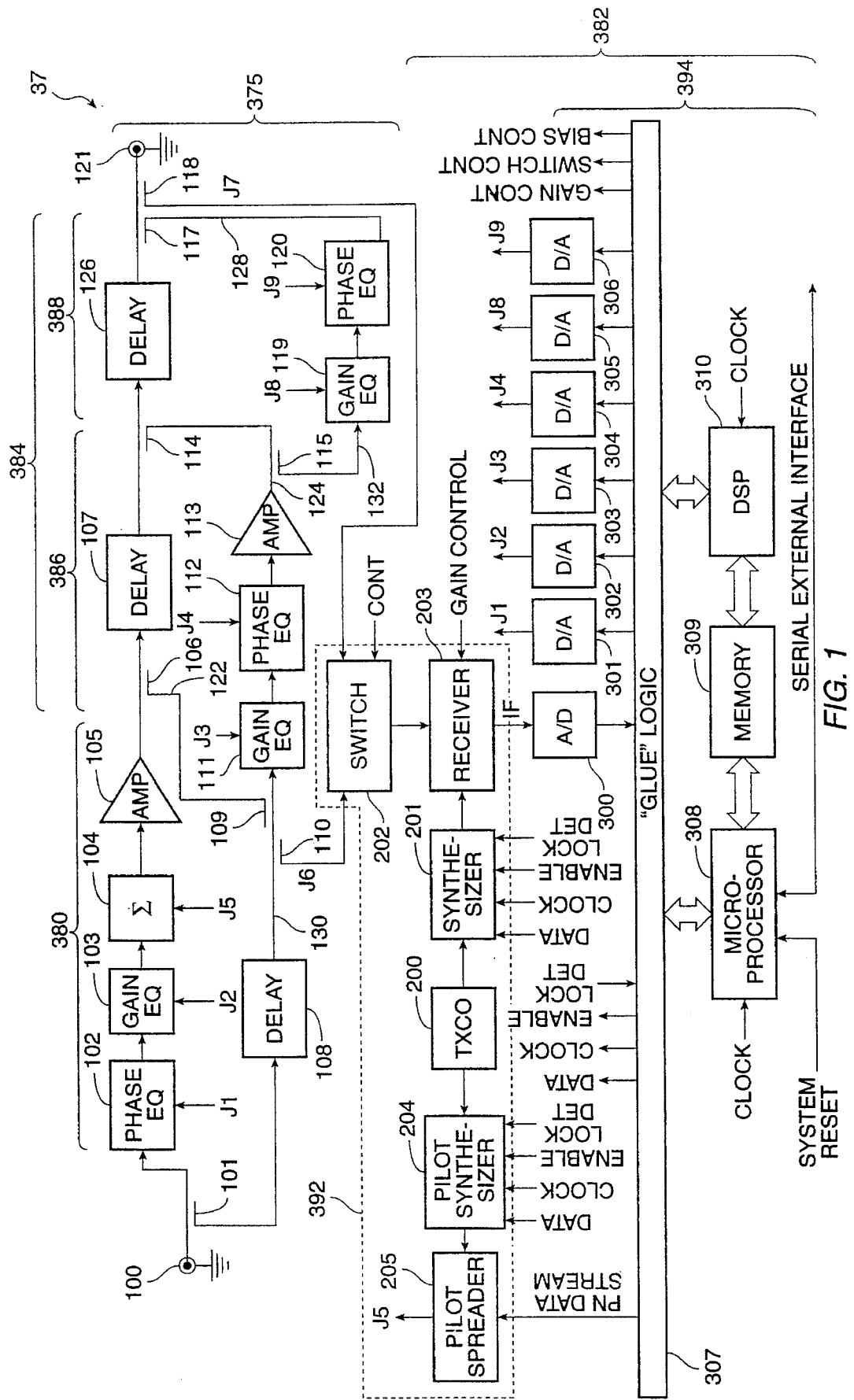
FIG. 1 is a feed-forward amplifier system with adaptive controller relying upon three monitoring points according to the present invention.
Figure 2:
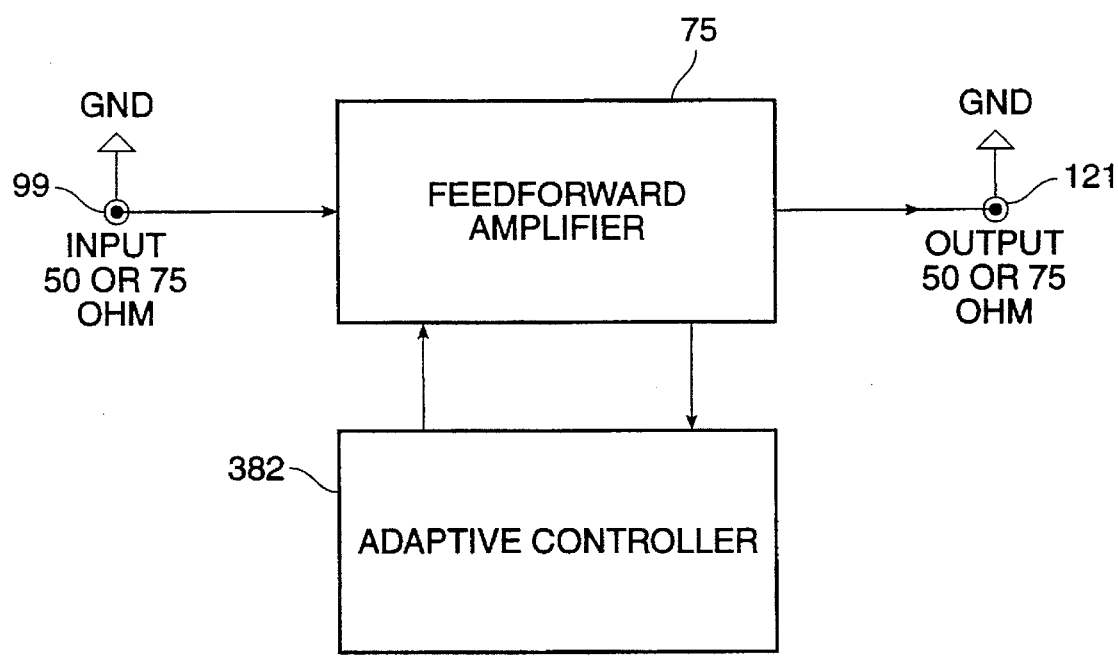
FIG. 2 is a block diagram of a feed-forward amplifier with an adaptive controller of the prior art.
Figure 3:
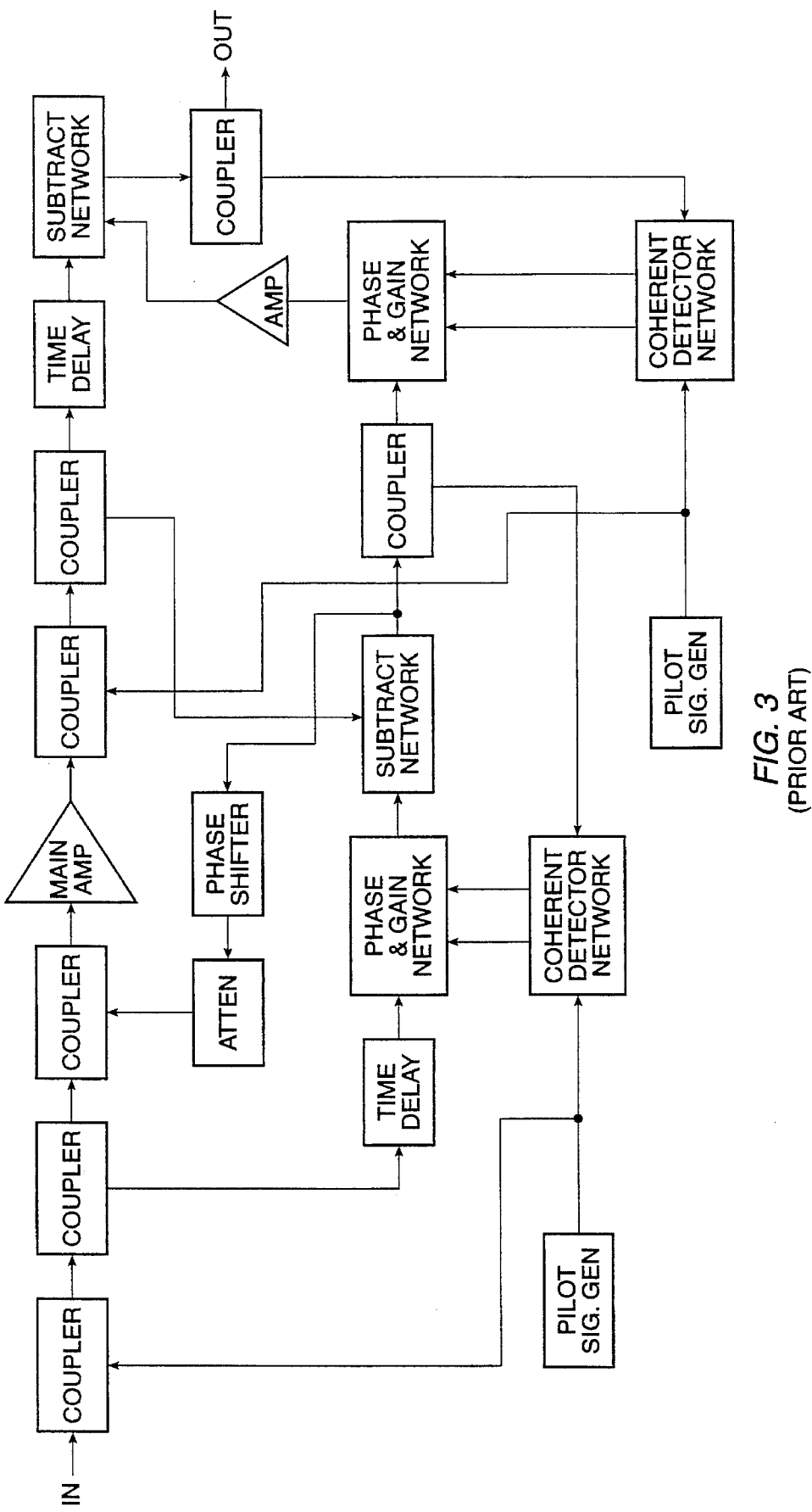
FIG. 3 is a block diagram of a feed-forward amplifier system with injected pilot signal of the prior art.
Figure 4:
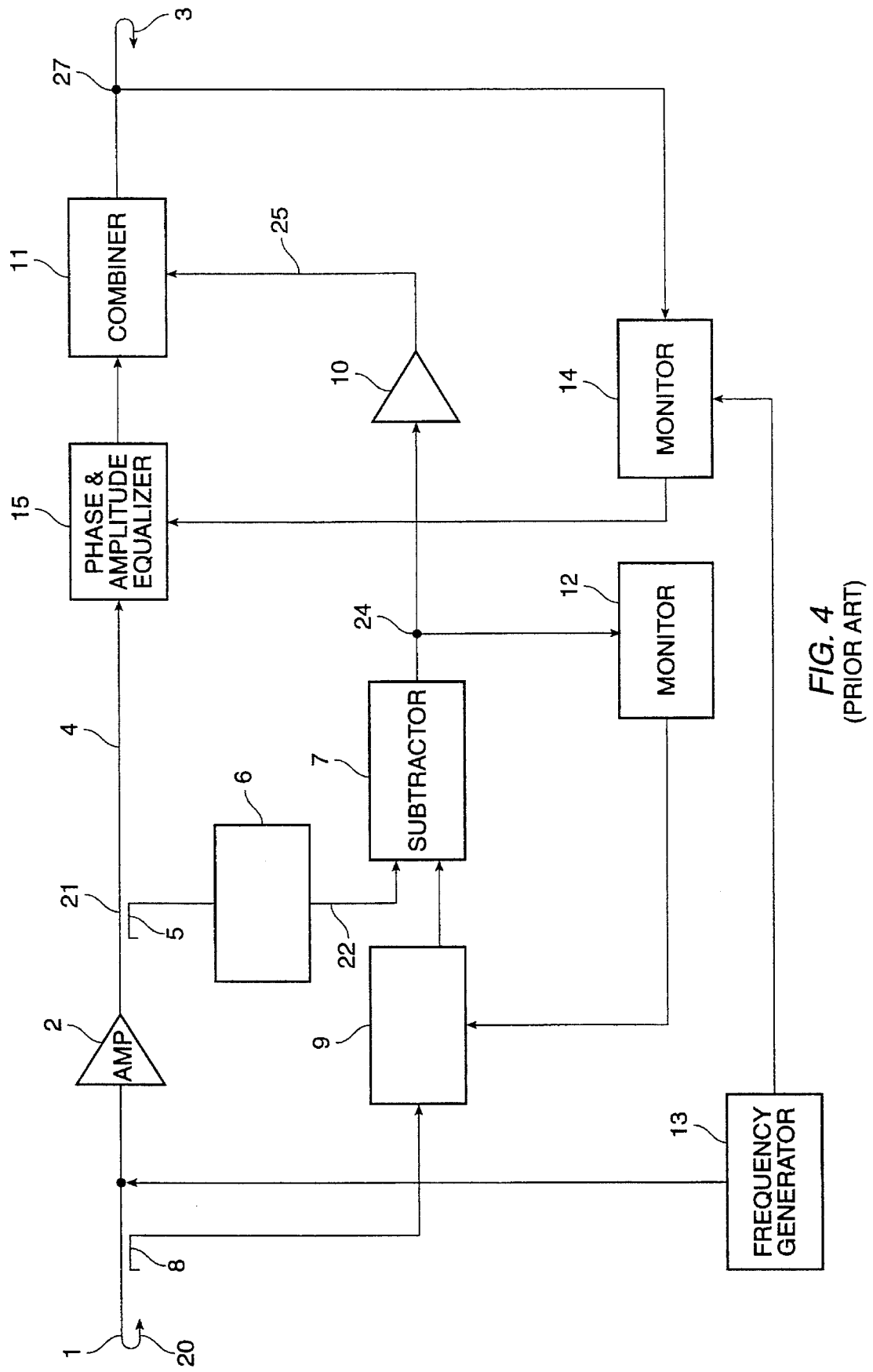
FIG. 4 is a feed-forward amplifier system of the prior art.

FIG. 1 shows a feed-forward amplifier system 370 comprising a feed-forward amplifier 375 and an adaptive controller system 382 according to the invention. Feed-forward amplifier 375 comprises feed-forward amplifier loop 380, and an adaptive distortion reduction system 384 comprising first and second distortion cancellation loops 386 and 388 respectively. The structure of feed-forward amplifiers is generally known in the art and is shown in FIG. 4. By contrast, referring again to FIG. 1, the feed-forward amplifier of the present invention uses a novel second distortion cancellation loop 388. Second distortion cancellation loop 388 comprises a cancellation path 132, fed by the output of the distortion (error) amplifier 113, third gain equalizer 119, third phase equalizer 120, third delay line 116, and residual distortion correction signal path 128.

Feed-forward amplifier loop 380, as shown in FIG. 1, comprises first gain equalizer 102, first phase equalizer 103, combiner 104, main amplifier 105, sampled amplified-signal path 122, and first delay line 108. An input signal 100 is applied to a coupler 101. The first output of coupler 101 is amplitude equalized by first gain equalizer 102 and then phase equalized by first phase equalizer 103. The phase and gain equalized signal is combined with the pilot (if used) in combiner 104 and then amplified to the desired level by main amplifier 105. The output of main amplifier 105 comprises the desired signal, unwanted distortion, and the pilot signal (if used).

The output of main amplifier 105 is applied to coupler 106 where a sample of the output is taken. This sample signal is applied to distortion (error) detector coupler 109 via sampled amplified-signal path 122. The second input of coupler 109 is the second output of coupler 101 delayed by first delay line 108.

If the propagation delay balance between the branch containing main amplifier 105 and the delay line branch with first delay line 108 is perfect, the output of distortion (error) detector coupler 109 (a subtracter) will be only the distortion introduced by main amplifier 105. When this condition does not exist, the adaptive controller according to the present invention will adjust first gain equalizer 102 and first phase equalizer 103 to make the output of distortion (error) detector coupler 109 as close as possible to the distortion signal only. The output of coupler 109 is the scaled distortion signal produced by main amplifier 105 and will be used to minimize distortion in the output of the feed-forward amplifier by using the first and second distortion (error) cancellation loops 386 and 388.

The distortion (error) signal 130 from distortion (error) detector coupler 109 is a sampled signal which is sampled continuously by sampler 110. The sampled signal from sampler 110 is sent to the adaptive controller system 382 for processing via J6.

The adaptive distortion reduction system 384 comprises first and second distortion (error) cancellation loops 386 and 388. First distortion (error) cancellation loop 386 comprises second gain equalizer 111, second phase equalizer 112, distortion (error) amplifier 113, and second delay line 107. Second distortion (error) cancellation loop 388 comprises third delay line 116, third gain equalizer 119, and third phase equalizer 120. The output of first delay line 108 combined with the continuously sampled output of amplifier 105 is first applied to second gain equalizer 111 and then second phase equalizer 112 for gain and phase equalization. A small continuously-sampled signal is taken at 110 and sent to the controller via J6. The amplitude and phase equalized distortion (error) signal is amplified by distortion (error) amplifier 113, yielding distortion (error) correction signal 124 which is applied to the distortion (error) cancellation coupler 114 (effectively a subtracter). The second input of distortion (error) cancellation coupler 114 is the delayed (by second delay line 107) output of main amplifier 105. Second delay line 107 is used to provide equal propagation delay along both signal paths of main amplifier 105 and distortion (error) amplifier 113. The second distortion (error) cancellation loop 388 uses samples of the distortion (error) correction signal 124 using the sampler 115. The sampled signal is then gain and phase equalized by third gain equalizer 119 and third phase equalizer 120. The output of third phase equalizer 120 is the residual distortion correction signal 128 which is the first input applied to the distortion cancellation coupler 117 (a subtracter). The second input to distortion cancellation coupler 117 is the desired plus residual-distortion signal 126, which is the output of subtracter 114, delayed by the third delay line 116.

If the gain and phase equalizers, and the delay lines in the main loop and the distortion (error) cancellation loops provide synchronous propagation delay between the two branches of each path, the output 121 will contain negligible distortion.

The output of distortion cancellation coupler 117 is sampled by sampler 118 before reaching output port 121. The sample signal (J7) is sent to the adaptive controller system 382 for processing.

B. Adaptive Controller System

The adaptive controller system 382 comprises three sub-units. They are:

1. RF sub-unit 392
2. Digital hardware sub-unit 394
3. Adaptive controller algorithm 396

FIG. 1 shows the adaptive controller system 382 according to the present invention.

1. RF sub-unit

The RF sub-unit 392 is shown in FIG. 1. RF sub-unit 392 comprises switch 202, receiver 203, synthesizer 201, reference clock 200, pilot synthesizer 204, and pilot spreader 205. It provides an interface between the digital processing domain and the amplifier system 370. It also provides the reference clock 200 for the local oscillator synthesizer 201 and pilot synthesizer 204. The other inputs of synthesizer 201 are the clock (CLK), data (Data), and latch enable (EN) signals. Synthesizer 201 also provides a lock detect (Lock Det) output signal which indicates if synthesizer 201 is out of lock. Frequency synthesizer 201 produces the local oscillator signals for the receiver 203. The receiver 203 down converts the output of the switch 202 to an intermediate frequency (I.F.) where the I.F. signal is filtered and amplified before being sampled. The receiver 203 can be a single (one I.F. stage) or double conversion (two I.F. stages) receiver. The receiver 203 can also be sampled directly at input frequency.

The switch 202 is controlled by the digital sub-unit 394. The control signal from the digital sub-unit 394 forces the switch 202 to select one of the signals from the monitoring points J6 and J7. The switch 202 is used to avoid duplication of the receivers for the two receive paths, from monitoring points J6 and J7. When higher speed is required, however, using two receivers is recommended.

The gain control signal adjusts the receiver 203 gain when necessary to keep the signal level at the input of the A/D 300 above the common voltage of A/D 300 and within the linear operation range of the A/D 300.

The synthesizer 204 will be used to generate a pilot frequency for the case where the distortion cancellation at the output of the feed-forward amplifier 380 is achieved by a pilot frequency. Similar to synthesizer 201 the pilot synthesizer 204 has four inputs (reference frequency, data, clock, latch enable) and one output to indicate the lock status of the synthesizer. Before being applied into feed-forward amplifier loop 380 at J5, the pilot signal is modulated by a random bit pattern in order to spread the pilot energy. Pilot spreader 205 performs the spreading function.

2. Digital hardware sub-unit

The adaptive controller digital hardware sub-unit 394 is shown in FIG. 1. The digital hardware sub-unit 394 comprises analog to digital (A/D) converter 300, digital to analog (D/A) converters 301, 302, 303, 304, 305 and 306, "glue logic" 307, micro-processor 308, memory 309, and digital signal processor (DSP) 310. For purposes of this disclosure, "glue logic" refers to conventional interface logic known in the art. The I.F. signal from the RF sub-unit 392 is converted to a digital signal by A/D converter 300. Digital control signals produced by DSP 310 for phase equalizers 103, 112, and 120 and gain equalizers 102, 111, and 119 are converted to analog signals by D/A converters 301, 302, 303, 304, 305 and 306 before being applied to the feed-forward amplifier loop 380 and adaptive distortion reduction system 384 through J1, J2, J3, J4, J8 and J9 respectively.

Glue logic 307 provides the interface from DSP 310 to A/D converters 300 and D/A converters 301, 302, 303, 304, 305 and 306. Glue logic 307 also serves as the interface for the programming for synthesizers 201 and 204, gain control of receiver 203, and input control of switch 202. Glue logic 307 will also serve as bias control for the feed-forward amplifier loop 380 and adaptive distortion reduction system 384.

DSP 310 executes the adaptive controller algorithm 396 and produces the feed-forward amplifier control signals for phase equalizers 103, 112 and 120 and gain equalizers 102, 111 and 119. The input to DSP 310 includes the digitally converted I.F. signal from the RF sub-unit 392 via A/D converter 300 and glue logic 307. DSP 310 also performs the programming for synthesizers 201 and 204.

Memory 309 stores the program which contains the adaptive controller algorithm 396 for use by DSP 310 and alarm and control software for use by micro-processor 308.

Micro-processor 308 may provide an interface to the outside world through an RS232 port. The micro-processor 308 also communicates with the DSP 310 to obtain diagnostic data as well as data to be used for frequency band spectrum analysis. The micro-processor 308 may also receive information on the operation and failure of various sections of the feed-forward amplifier loop 380, adaptive distortion reduction system 384, power supply, fan, heat sink, and the adaptive controller system 382 hardware. Receipt of this information is not essential to this invention.

3. Adaptive Controller Algorithm

The adaptive controller algorithm 396 which will be executed by DSP 310 comprises two functions. They are:

a. Power measurement/Estimation.

b. Search Algorithm/Correction.

a. Power measurement/Estimation

Figure 5:
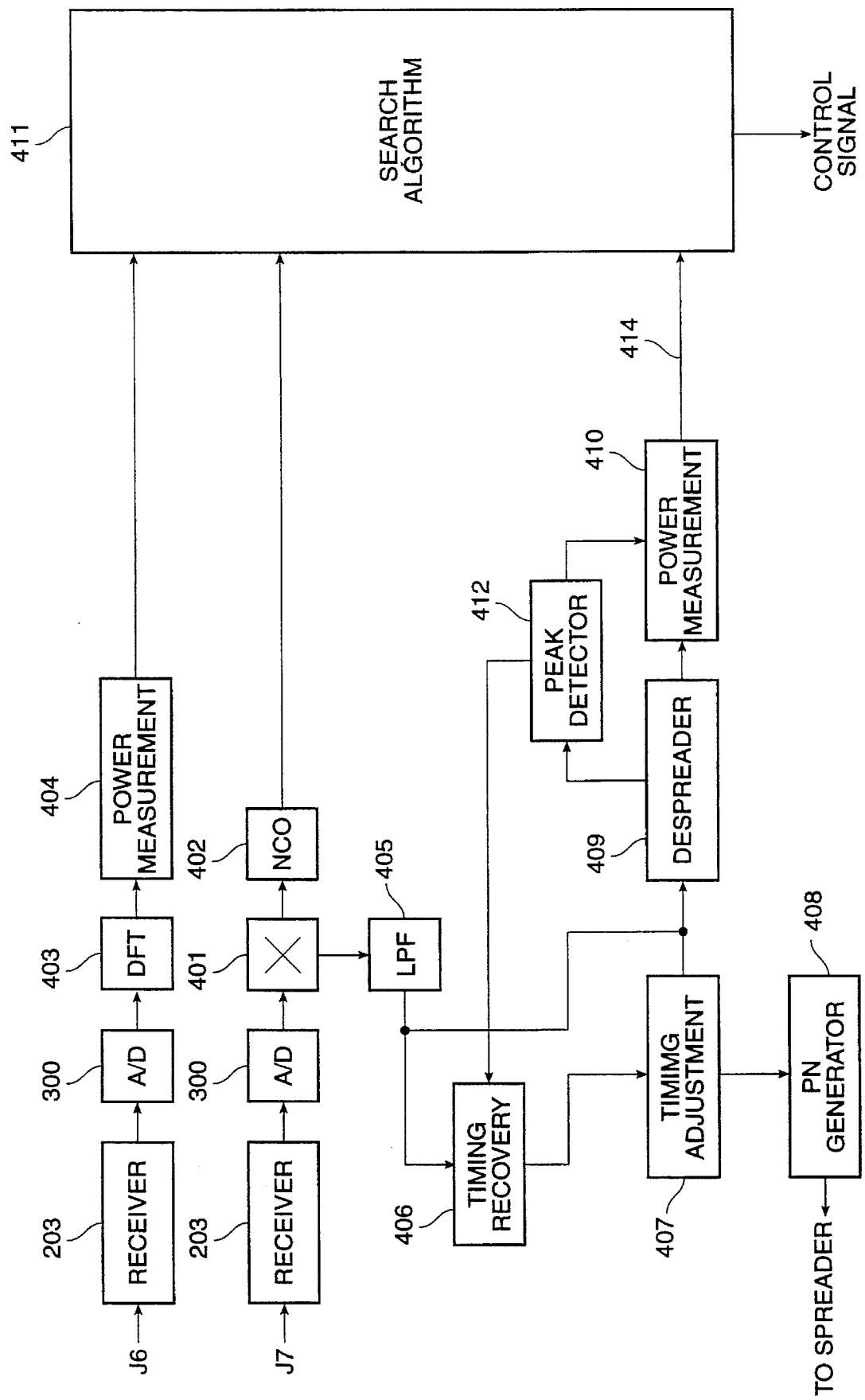
FIG. 5 is a block diagram of a device according to the present invention for carrying out power measurement and estimation.

FIG. 5 illustrates the distortion (error) estimation at the output of the adaptive distortion reduction system 384 (see FIG. 1) and the wanted signal estimation at the input of the first distortion (error) cancellation loop 386 (see FIG. 1) in accordance with the invention. The process is executed in two steps of power measurement and estimation. For power measurement the frequency band of interest is divided into smaller segments of ΔF bandwidth. The synthesizer 201 (see FIG. 1) tunes into the center frequency of these bands and facilitates the receiver's 203 down conversion of the ΔF band to an I.F. frequency for filtering and amplification. The I.F. signal is then sampled (sub-harmonic sampling may be used) by A/D converter 300 that provides the required linearity and dynamic range. The function of down conversion, filtering, amplification, and A/D conversion is performed for the signals from J6 and J7 one at a time. The switch 202 will select one of the signals J6 or J7. The synthesizer 201 will tune to the center of the ΔF bands starting from the beginning of the amplifier operating frequency band and continuing to the end of the frequency band for the signals at J6. For the signal at J7 a substantially wider bandwidth (at least three times the main amplifier 105 operating frequency band) has to be swept in order to capture the distortion which appears out of band.

The signal from J6, after being converted into a digital signal, is squared by discrete Fourier transformer (DFT) 403 and averaged by power measurement block 404. The process of squaring and averaging is performed for each individual ΔF frequency band over the total operating band of the feed-forward amplifier loop 380 and adaptive distortion reduction system 384. The output of the power measurement block 404, which is the wanted signal estimation at the input of the error amplifier, is applied into the search algorithm block 411 to be minimized by adjusting the control signal of the first gain equalizer 102 and the first phase equalizer 103 in the feed-forward amplifier loop 380.

The signal from J7 consists of only the ΔF band that contains the pilot. This signal, after being converted into a digital signal, is down converted to DC by the mixer 401 using the NCO oscillator 402 before being filtered by low-pass filter 405. The filtered signal is despread by the despreader block 409 and then applied into the power measurement block 410 for power measurement. The pilot measured power 414 is then applied to the search algorithm 411 to be minimized by adjusting the gain equalizers 111 and 119 and phase equalizers 112 and 120. The second input to the despreader 409 is supplied by the PN generator 408 after being time adjusted by the timing adjustment block 407. The timing adjustment block 407 has its timing controlled by timing recovery block 406 which uses an output of the low-pass filter 405 and the peak detector 412 output for timing estimation. The peak detector 412 uses an output of the despreader 409 to detect the peak power and triggers the start of the measurement by power measurement block 410.

b. Search Algorithm/Correction

The search algorithm that is executed by DSP 310 obtains the results of the power measurement algorithms and calculates the correction values for the equalizer components in the main amplifier and error cancellation loops. The search algorithms for the main amplifier and for the error amplifier are different and independent. The search algorithm for the main amplifier receives the measured power for the ΔF bands within the operating band of the amplifier, sums them up and then, based on the total power, calculates the adjustment value for the phase equalizer 102. The search algorithm continues adjusting the phase of phase equalizer 102 over a number of sweeps until it reaches a minimum. Once a minimum is reached the algorithm will adjust the gain equalizer 103 in a similar manner until it reaches a minimum. This process is repeated.

Similar techniques of correction or adjustment are used by the search algorithm for the error amplifier loop. The two search algorithms are totally independent. The search algorithm for the error amplifier receives the power of the in-band and out-of-band distortion (when pilot is not used), sums them up and calculates the adjustment value or correction value for phase equalizers 112, and 120 and the gain equalizers 111, and 119. When a pilot is used the search algorithm will only need the measured power of the pilot for the adjustment process. While many alternative search algorithms might be used, particularly useful search algorithms are disclosed in U.S. patent application Ser. No. 08/282,132 filed Jul. 28, 1994 in the name of Kiomars Anvari entitled FEED-FORWARD POWER AMPLIFIER SYSTEM WITH ADAPTIVE CONTROL AND CONTROL METHOD, which is incorporated herein by reference and made a part hereof.

The invention has now been explained with reference to specific embodiments. Other embodiments will be apparent to those of ordinary skill in the art upon reference to the previous detailed description in connection with the accompanying claims. It is therefore not intended that this invention be limited, except as indicated by the appended claims.

What is claimed is:

1. In a method for linear amplification of wideband radio frequency energy in a feed-forward amplifier system having at least a main amplifier, a method for correcting distortion in amplification of an information signal, said method comprising the steps of:

injecting variable phase spread spectrum pilot components into a main signal path prior to amplification;

monitoring said amplified spread spectrum pilot components at output of said main signal path after output of said main amplifier to produce a monitored output;

estimating power level of the monitored output to produce analyzed signals;

formulating error correcting signals from said analyzed signals;

adjusting time of pseudo-noise modulation input to said variable phase spread spectrum pilot components using said selected ones of said error correcting signals; and correcting said distortion in amplification of said information signals by means of said error correcting signals applied to a distortion amplifier connected in parallel with said main amplifier.

2. The method according to claim 1 further including the steps of:

monitoring input signals of said distortion amplifier for presence of wanted output signals from said main amplifier after subtraction of unamplified signals;

measuring at least power level of said wanted signals to produce a wanted signal metric; and equalizing gain and phase of input signals to said main amplifier to minimize said wanted signal metric.

3. In a method for linear amplification of wideband radio frequency energy in a feed-forward amplifier system having at least a main amplifier, a method for correcting distortion in amplification of an information signal, said method comprising the steps of:

injecting spread spectrum pilot components into a main signal path prior to amplification;

monitoring said amplified spread spectrum pilot components at output of said main signal path after output of said main amplifier to produce a monitored output;

estimating power level of the monitored output to produce analyzed signals;

formulating error correcting signals from said analyzed signals; and correcting said distortion in amplification of said information signals by means of said error correcting signals applied to a distortion amplifier connected in parallel with said main amplifier;

monitoring input signals of said distortion amplifier for presence of wanted output signals from said main amplifier after subtraction of unamplified signals;

measuring at least power level of said wanted signals to produce a wanted signal metric; and equalizing gain and phase of input signals to said main amplifier to minimize said wanted signal metric;

wherein said measuring step comprises:

sampling said wanted signals after subtraction to produce sampled values;

squaring the absolute value of said sampled values to obtain squared values representative of instantaneous power; and averaging said instantaneous power over a selected period to produce a wanted signal estimation.

4. In a method for linear amplification of wideband radio frequency energy in a feed-forward amplifier system having at least a main amplifier, a method for correcting distortion in amplification of an information signal, said method comprising the steps of:

injecting spread spectrum pilot components into a main signal path prior to amplification;

monitoring said amplified spread spectrum pilot components at output of said main signal path after output of said main amplifier to produce a monitored output;

estimating power level of the monitored output to produce analyzed signals;

formulating error correcting signals from said analyzed signals; and correcting said distortion in amplification of said information signals by means of said error correcting signals applied to a distortion amplifier connected in parallel with said main amplifier;

wherein said estimating step further comprises:

despreading said amplified spread spectrum pilot components to produce a pilot signal;

analyzing said pilot signal to produce a set of control signals;

injecting into the main signal path after an appropriate delay a residual distortion correction signal, said residual distortion correction signal being an equalized amplification of said error correcting signals further modified by one of said set of control signals, to correct for distortion in said distortion amplifier.

5. The method according to claim 1 wherein said estimating step comprises despreading said spread spectrum pilot components.

6. A feed-forward linear amplification system for amplifying radio frequency energy, said system comprising:

a main amplifier;

a distortion detector for detecting distortion in an output signal of said main amplifier, said distortion detector including means for detecting a feedback-controlled variable phase spread spectrum pilot components in said output signal;

a distortion amplifier for amplifying a distortion signal from said main amplifier; and an adaptive controller coupled to said distortion detector, said adaptive controller comprising main distortion cancellation means for cancelling distortion in an output signal of said amplification system, said adaptive controller further comprising residual distortion cancellation means for cancelling a residual distortion remaining after application of said main distortion cancellation means and means for injecting said feedback-controlled variable phase spread spectrum pilot into said output signal.

7. The amplification system according to claim 6 wherein said main distortion cancellation means includes means for producing a first set of control signals for adaptively varying phase and gain of input signals entering said distortion amplifier.

8. The amplification system according to claim 7 wherein said adaptive controller is coupled to receive samples of said output signal of said feed-forward linear amplification system and to digitally process said samples to produce at least said first set of control signals.

9. The amplification system according to claim 6 wherein said main distortion cancellation means comprises a first phase equalizer and a first gain equalizer operationally positioned at an input of said distortion amplifier.

10. A feed-forward linear amplification system for amplifying radio frequency energy, said system comprising:

a main amplifier;

a distortion detector for detecting distortion in an output signal of said main amplifier;

a distortion amplifier for amplifying a distortion signal from said main amplifier; and an adaptive controller coupled to said distortion detector, said adaptive controller comprising main distortion cancellation means for cancelling distortion in an output signal of said amplification system, said adaptive controller further comprising residual distortion cancellation means for cancelling a residual distortion remaining after application of said main distortion cancellation means, wherein said residual distortion cancellation means includes means for producing a second set of control signals for adaptively varying phase and gain of output signals from said distortion amplifier.

11. The amplification system according to claim 10 wherein said adaptive controller is coupled to receive samples of said output signal of said feed-forward linear amplification system and to digitally process said samples to produce at least said second set of control signals.

12. A feed-forward linear amplification system for amplifying radio frequency energy, said system comprising:

a main amplifier;

a distortion detector for detecting distortion in an output signal of said main amplifier;

a distortion amplifier for amplifying a distortion signal from said main amplifier; and an adaptive controller coupled to said distortion detector, said adaptive controller comprising main distortion cancellation means for cancelling distortion in an output signal of said amplification system, said adaptive controller further comprising residual distortion cancellation means for cancelling a residual distortion remaining after application of said main distortion cancellation means;

wherein said residual distortion cancellation means comprises a second phase equalizer and a second gain equalizer operationally positioned between output of said distortion amplifier and output of said feed-forward linear amplification system.

13. The amplification system according to claim 6 wherein said main distortion cancellation means comprises means for subtractively combining a distortion correction signal from an output of said distortion amplifier with said main amplifier output signal to leave a desired signal and a residual distortion signal.

14. The amplification system according to claim 13 wherein said residual distortion cancellation means comprises means for subtractively combining said desired signal and said residual distortion signal with a residual distortion correction signal from said residual distortion cancellation means.

15. The amplification system according to claim 14 further including a second gain equalizer and a second phase equalizer for processing said residual distortion correction signal, said second gain equalizer and said second phase equalizer being controlled by said adaptive controller.

16. The amplification system according to claim 6 wherein said distortion amplifier has a bandwidth substantially greater than an operational bandwidth of said main amplifier.

17. The amplification system according to claim 6 wherein said adaptive controller includes means for providing an alarm signal whenever system control becomes unacceptably imbalanced.

18. The amplification system according to claim 6 wherein said adaptive controller further comprises means for monitoring input carriers and dynamically adjusting a bias of said main amplifier to improve overall system power efficiency.

19. A distortion reduction apparatus for use with an amplification system, said apparatus comprising:

a distortion amplifier;

detection means for detecting distortion in an input signal to said apparatus, said input signal including a feedback controlled variable phase pilot;

first and second equalization means for equalizing a characteristic of said distortion in said input signal;

an adaptive controller coupled to said detection means; and first and second cancellation means for reducing said distortion in said input signal, at least one of said first and second cancellation means for injecting said feedback-controlled variable phase spread spectrum pilot.

20. The distortion reduction apparatus according to claim 19 wherein said first equalization means comprises a first gain equalizer and a first phase equalizer, said equalizers receiving control signals from said adaptive controller to equalize a sampled signal from said input signal.

21. The distortion reduction apparatus according to claim 20 wherein said second equalization means comprises a second gain equalizer and a second phase equalizer, said equalizers receiving control signals from said adaptive controller to equalize a sampled signal from an amplified distortion signal from said distortion amplifier.

22. A distortion reduction apparatus for use with an amplification system, said apparatus comprising:

a distrotion amplifier;

detection means for detecting distortion in an input signal to said apparatus;

first and second equalization means for equalizing a characteristic of said distortion in said input signal;

said first equalization means comprising a first gain equalizer and a first phase equalizer, said first and second equalizers receiving control signals from said adaptive controller to equalize a sampled signal from said input signal;

an adaptive controller coupled to said detection means; and first and second cancellation means for reducing said distortion in said input signal;

wherein said first cancellation means comprises a first subtract or for combining said input signal, appropriately delayed, with an amplified output signal of said distortion amplifier, leaving a desired amplified signal and a residual distortion signal.

23. The distortion reduction apparatus according to claim 22 wherein said second cancellation means comprises a second subtractor for combining said desired amplified signal and said residual distortion signal with a residual distortion correction signal from said second cancellation means to reduce said residual distortion signal.

24. The distortion reduction apparatus according to claim 19 wherein said adaptive controller produces control signals by processing a sample of said input signal and a sample of an output signal of said distortion reduction apparatus.

* * * * *